(12) United States Patent
Puzey et al.

(10) Patent No.: US 6,517,944 B1
(45) Date of Patent: Feb. 11, 2003

(54) MULTI-LAYER PASSIVATION BARRIER FOR A SUPERCONDUCTING ELEMENT

(75) Inventors: Kenneth A. Puzey, Essex Junction, VT (US); Thomas G. Ference, Essex Junction, VT (US)

(73) Assignee: TeraComm Research Inc., Essex Junction, VT (US)

( * ) Notice: Subject to any disclaimer, the term of this patent is extended or adjusted under 35 U.S.C. 154(b) by 0 days.

(21) Appl. No.: 09/632,134

(22) Filed: Aug. 3, 2000

(51) Int. Cl.[7] .......................... H01L 39/00; H01L 39/12
(52) U.S. Cl. .................. 428/446; 428/448; 428/469; 428/689; 428/697; 428/698; 428/701; 505/231; 505/235; 505/237; 505/238; 505/300
(58) Field of Search ................. 428/648, 655, 428/671, 680, 448, 469, 472, 498, 499, 702, 704, 697, 701; 505/230, 231, 235, 237, 238, 300, 776

(56) References Cited

U.S. PATENT DOCUMENTS

| | | | |
|---|---|---|---|
| 3,840,398 A | | 10/1974 | Sonntag .................. 117/217 |
| 4,965,244 A | | 10/1990 | Weaver et al. .................. 505/1 |
| 5,114,910 A | | 5/1992 | Josefowicz et al. ............. 505/1 |
| 5,130,295 A | | 7/1992 | Labib .............................. 505/1 |
| 5,164,360 A | * | 11/1992 | Woolf et al. .................... 505/1 |
| 5,173,474 A | * | 12/1992 | Connell et al. ................. 505/1 |
| 5,196,379 A | | 3/1993 | Weaver et al. .................. 505/1 |
| 5,232,900 A | | 8/1993 | Bartur ............................ 505/1 |
| 5,264,375 A | * | 11/1993 | Bang et al. ..................... 437/3 |
| 5,272,133 A | | 12/1993 | Josefowicz et al. ............. 505/1 |
| 5,288,697 A | | 2/1994 | Schrepp et al. ................ 505/1 |
| 5,411,938 A | | 5/1995 | Wu et al. ..................... 505/430 |
| 5,416,062 A | | 5/1995 | Harada et al. ............... 505/237 |
| 5,420,102 A | * | 5/1995 | Harshavardhan et al. ... 505/237 |
| 5,432,151 A | | 7/1995 | Russo et al. ................ 505/474 |
| 5,438,037 A | | 8/1995 | Tanaka ........................ 505/329 |
| 5,462,918 A | | 10/1995 | Nakamura et al. .......... 505/193 |
| 5,480,861 A | | 1/1996 | Tanaka et al. .............. 505/236 |
| 5,498,595 A | | 3/1996 | Eccleston ................... 505/235 |
| 5,665,628 A | | 9/1997 | Summerfelt .................... 438/3 |
| 5,851,896 A | | 12/1998 | Summerfelt ................ 438/396 |
| 5,866,195 A | | 2/1999 | Lemelson .................... 427/62 |
| 5,898,020 A | | 4/1999 | Goyal et al. ................ 505/239 |
| 5,906,965 A | | 5/1999 | Rao .......................... 505/470 |
| 5,974,336 A | | 10/1999 | Yamada et al. ............ 505/230 |
| 6,154,599 A | * | 11/2000 | Rey .......................... 385/141 |
| 6,159,610 A | * | 12/2000 | Paranthaman et al. ...... 428/472 |

FOREIGN PATENT DOCUMENTS

| | | | |
|---|---|---|---|
| JP | 6453478 | 3/1989 | ........... H01L/39/22 |

OTHER PUBLICATIONS

List et al, High Jc YBCO films on biaxially textured Ni with oxide buffer layers deposited using electron beam evaporation and sputtering, Pysica C 302 (1998) pp. 87–92.*

Andreev et al., "Dielectric silicon nitride coatings deposited on high–$T_C$ superconducting films," Superconductivity 3(8), Aug. 1990, pp. S317–S320.

Q.X. Jia & W.A. Anderson, "$SiO_2$ and $Si_3N_4$ passivation layers on Y–Ba–Cu–O thin films," Journal of Applied Physics, vol. 66, No. 1, Jul. 1, 1989, pp. 452–454.

* cited by examiner

Primary Examiner—Deborah Jones
Assistant Examiner—Stephen Stein
(74) Attorney, Agent, or Firm—Downs Rachlin Martin PLLC (57) ABSTRACT

A multi-layer passivation barrier (24) for, and a method of, passivating a superconducting layer (22) of a microelectronic device (20). The passivation barrier includes a passivating layer (32) and a barrier buffering layer (30). The passivating layer provides a barrier to moisture, salts, alkali metals and the like located outside the device. The passivating layer also provides a barrier to outdiffusion of oxygen from the superconducting layer. The buffering layer permits oxygen to diffuse therethrough and provides a barrier to prevent diffusion of one or more constituent chemical elements of the passivating layer into the superconducting layer. The method includes the steps of depositing the barrier buffering layer (30) onto the superconducting layer (22) and depositing the passivating layer (32) onto the buffering layer.

16 Claims, 7 Drawing Sheets

MULTI-LAYER PASSIVATION BARRIER FOR A SUPERCONDUCTING ELEMENT

FIELD OF THE INVENTION

The present invention generally relates to the field of passivating micro-electronic devices and, more specifically, to a multi-layer passivation barrier for a superconducting element.

BACKGROUND OF THE INVENTION

Increasingly, microelectronic devices are being designed and manufactured to incorporate superconducting elements in order to take advantage of the special properties of the superconducting materials from which those elements are made. Superconducting elements, particularly those made of oxide superconducting materials, however, are subject to degradation over time due to the indiffusion of impurities from outside the superconducting element and outdiffusion of oxygen from within the superconducting material. This in- and outdiffusion alters a superconducting material's critical properties, i.e., critical temperature ($T_c$), critical current density ($J_c$) and critical magnetic field ($H_c$), which can destroy its superconducting state under desired operating conditions.

Generally, microelectronic superconductor devices include superconducting elements which each comprise one or more thin film layers of an oxide superconducting material, such as Bi—Sr—Ca—Cu—O, Y—Ba—Cu—O, Tl—Ba—Ca—Cu—O, Hg—Ba—Ca—Cu—O or any other superconductor oxide. Each superconducting layer is typically adjacent other layers, such as substrate, insulator and buffer layers, which also comprise the superconducting device. These adjacent layers often contain chemical elements, such as silicon and nickel, that can diffuse into the superconducting element and destroy its superconducting state. In addition, the layers adjacent to each superconducting layer may allow chemical elements from other layers and/or impurities located outside the device, e.g., moisture, salts, alkali metals and the like, to diffuse into and destroy the superconducting state of the superconducting material. Moreover, one or more of the adjacent layers may have a large enough oxygen diffusion constant such that they will allow oxygen to outdiffuse from the superconducting material at an unacceptably high rate that destroys the superconducting state of the superconducting material.

Over the years, a number of barriers have been proposed and/or used to protect, or passivate, oxide superconducting elements from the indiffusion of impurities and outdiffusion of oxygen that are so detrimental to the superconducting state of the superconducting material. However, each of these barriers has at least one shortcoming.

U.S. Pat. No. 4,965,244 to Weaver et al., discloses a passivation layer made of $CaF_2$, which is applied to the surface of a high-temperature superconducting element. U.S. Pat. No. 5,196,379, also to Weaver et al., discloses a method of depositing an oxide passivation layer onto a superconducting element, where the passivation layer is an oxide of Al, Bi, Si, or Al—W. The passivation layers disclosed in the two Weaver et al. patents, however, are not good barriers to outdiffusion of oxygen from the superconducting material. Moreover, these layers contain chemical elements, such as Si, that are known to degrade the superconductive properties of many superconducting materials.

U.S. Pat. No. 5,411,938 to Wu et al. discloses a glass layer for protecting a superconducting element from moisture and other environmental substances that are detrimental to its superconducting properties. Similar to the passivation layers disclosed in the Weaver et al. patents, the glass layer of Wu et al. is not a good diffusion barrier to outdiffusion of oxygen from the superconducting material.

U.S. Pat. Nos. 5,114,910 and 5,272,133 to Josefowicz et al. each disclose a two-layer passivation barrier consisting of a Group II element, e.g., Mg, Ca, Ba, and Sr, oxide layer deposited onto an oxide superconducting element and a polymer layer applied to the Group II oxide layer. The Group II oxide layer must be deposited as an amorphous film and does not block oxygen and/or moisture from reaching the superconducting element. In addition, it is believed that certain Group II elements may diffuse out of the corresponding oxide layer into the superconducting element and therefore may be detrimental to the superconducting material over a period of time. Moreover, the polymer layer is not a good barrier to oxygen and is not compatible with back-end-of-line processing, which frequently is performed at temperatures that would destroy the polymer layer.

U.S. Pat. No. 5,866,195 to Lemelson discloses using a diamond film as an insulating layer. High-quality diamond is typically processed at high temperatures that would cause oxygen outdiffusion from a superconducting material, thus lowering its critical temperature. In addition, carbon from the processing of the diamond layer can be detrimental to superconductor devices integrated with superconductor devices. Moreover, further processing of the diamond film at temperatures above 500° C. in the presence of oxygen will reduce it to carbon dioxide, thus preventing a post-deposition oxygen anneal.

U.S. Pat. No. 5,480,861 to Tanaka et al. discloses a noble metal layer disposed between a thin film insulating layer and a thin film oxide superconducting element. The noble metal layer must be deposited on the superconducting element as a mono-layer in order for the insulating layer to be epitaxial. If the insulating layer were not epitaxial, the resulting reduced crystallinity would be detrimental to the properties of that layer. The noble metal layer is deposited while the temperature of the superconducting element is 700° C. Such a high temperature causes oxygen to outdiffuse from the superconducting material, lowering its critical temperature. In addition, the noble metal layer can act as an electrical short in some circumstances.

SUMMARY OF THE INVENTION

The present invention is directed to a passivation barrier for an oxygen-containing material having a physical property. The passivation barrier comprises a first layer made of a nonpolymer material and having a first surface and a second surface. The non-polymer material comprises a constituent element that changes the physical property of the oxygen-containing material when the constituent element diffuses into the oxygen-containing material. The barrier further comprises a second layer made of a non-conductive material and having a first surface and a second surface. The first surface of the second layer confronts the second surface of the first layer. The second surface of the second layer confronts the oxygen-containing material. The second layer is a barrier to diffusion of the constituent element from the first surface of the second layer to the second surface of the second layer.

The present invention is also directed to a method of passivating an oxygen-containing material. The method includes providing a first material containing oxygen and having a physical property. Also provided is a second material containing a constituent chemical element that changes the physical property of the first material when the constituent chemical element diffuses into the first material. The second material is a non-polymer. Further provided is a third material that is a barrier to diffusion of the constituent element. The third material is deposited onto at least a portion of the first material to form a buffering layer. The second material is deposited onto at least a portion of the buffering layer to form a passivating layer.

BRIEF DESCRIPTION OF THE DRAWINGS

For the purposes of illustrating the invention, the drawings show a form in which the invention may be embodied. It should be understood, however, that the invention is not limited to the precise arrangements and instrumentalities shown.

DETAILED DESCRIPTION OF THE DRAWINGS

Figure 1:
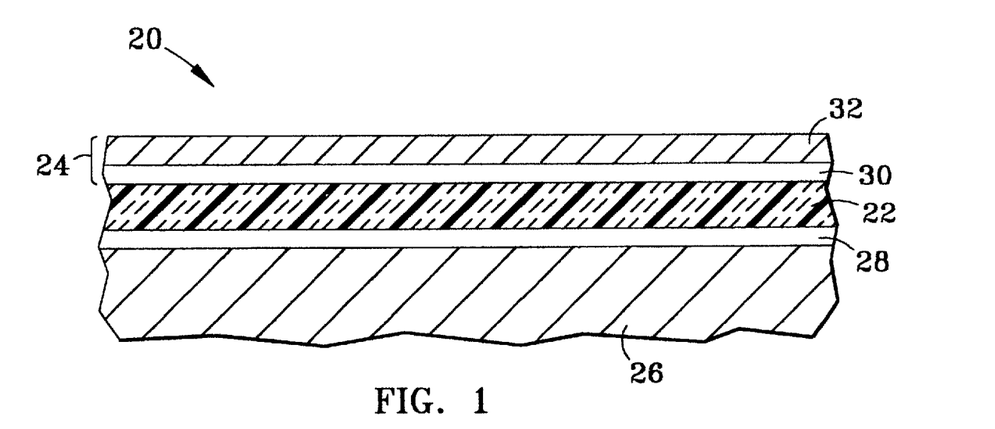
FIG. 1 is a partial cross-sectional view illustrating a microelectronic device having a planar superconducting layer and a passivation barrier according to the present invention.

Referring now to the drawings, wherein like numerals indicate like elements, FIG. 1 illustrates a microelectronic device, which is generally denoted by the numeral 20. Microelectronic device 20 includes a planar superconducting layer 22 made of an oxide superconducting material and a two-layer passivation barrier 24 therefore, in accordance with the present invention. Passivation barrier 24 protects superconducting layer 22 from impurities, such as moisture, salts, alkali metals and the like, located outside device 20 and limits outdiffusion of oxygen from the superconducting material that would alter its critical properties, $T_c$, $J_c$ and $H_c$. Moreover, passivation barrier 24 provides a measure of protection against mechanical damage, e.g., scratching, denting or the like, to superconducting layer 22.

FIG. 1 shows the passivation barrier of the present invention in a rudimentary application wherein the barrier covers a planar superconducting layer. The barrier, however, may be used in more complex applications, such as light modulation switches, waveguides, Josephson junctions, filters, antennae and the like. FIGS. 2–6 illustrate some of these more complex applications and also illustrate additional advantageous features of the passivation barrier. These embodiments are not meant to be exhaustive of the applications to which the present invention is suited, but are merely illustrative of the variety of applications that will occur to those skilled in the art. In addition, the barrier may be used for passivating oxygen-containing materials, or layers, other than oxide superconducting materials.

Referring to FIG. 1, microelectronic device 20 further comprises a substrate 26 and a plurality of thin film layers that are deposited onto substrate 26 or one another by various methods known to those skilled in the art. In the preferred embodiment, substrate 26 comprises silicon or, alternatively, biaxial textured nickel. However, other materials, such as silicon germanium, magnesium oxide, sapphire, diamond, strontium titanate, lanthanum aluminate, sapphire or the like, may be used.

A buffering layer 28 may be located between substrate 26 and superconducting layer 22 to provide a barrier to the diffusion of a constituent chemical element, i.e., silicon or nickel, of substrate 26 into oxide superconducting layer 22. Silicon is known to diffuse into oxide superconducting materials and destroy their superconducting properties. Therefore, a buffering layer, such as buffering layer 28, is typically provided between a silicon-containing layer and a superconducting layer. Buffering layer 28 may be omitted when outdiffusion of a constituent element of substrate 26 into superconducting layer 22 is not a concern and there is little lattice mismatch and thermal expansion coefficient mismatch. Furthermore, instead of being deposited onto substrate 26, buffering layer 28 may be deposited on another layer containing one or more constituent chemical element detrimental to superconducting layer 22 such that the buffering layer is in contact with the superconducting layer.

Buffering layer 28 is preferably made of yttria stabilized zirconium (YSZ). YSZ is preferred because it is a barrier to diffusion of silicon and nickel, which are respective constituent chemical elements of the two presently-preferred substrate materials. When silicon is selected as the substrate material, YSZ is also preferred because it provides a lattice constant and a thermal expansion coefficient intermediate to those of silicon substrate 20 and oxide superconducting layer 22. An intermediate lattice constant produces a higher quality epitaxial growth of subsequent layers than if a material not having an intermediate lattice constant were used. Similarly, an intermediate thermal expansion coefficient provides more thermal compatibility among the layers. The YSZ of buffering layer 28 is preferably deposited onto substrate 26 using plasma-enhanced reactive sputtering (PERS). Other techniques may include plasma-enhanced chemical vapor deposition (PECVD), laser ablation, pulsed laser deposition, molecular beam epitaxy and the like. Preferably, the YSZ of superconducting buffering layer 28 is deposited in a thickness of approximately 500 Å. However, it is presently contemplated that an acceptable range of thickness of the YSZ is 100 Å to 1000 Å, although other thicknesses may be satisfactory. Although YSZ is the presently-preferred material for the buffering layer, other materials, such as cerium oxide (ceria) and the like, may be used.

Superconducting layer 22 is deposited onto buffering layer 28, or substrate 26 when the buffering layer is not required, using, for example, PERS, PECVD, laser ablation, pulsed laser deposition, molecular beam epitaxy, or the like. The material for superconducting layer 22 may be any oxide superconductor material, such as Y—Ba—Cu—O, Bi—Sr—Ca—Cu—O, Tl—Ba—Ca—Cu—O, and Hg—Ba—Ca—Cu—O, among others. Passivation barrier 24 comprises a barrier buffering layer 30 deposited onto superconducting layer 22 and a passivating layer 32 deposited onto barrier buffering layer 30. Important features of barrier buffering layer 30 are that it permits the diffusion of oxygen therethrough and provides a barrier to the constituent chemical elements of passivating layer 32 that would otherwise diffuse into superconducting layer 22 and degrade its critical properties. An important feature of passivating layer 32 is that it provide a good barrier to outdiffusion of oxygen from superconducting layer 22 and indiffusion of moisture, salts, alkali metals and the like from outside device 20. In an alternative embodiment, the passivation barrier of the present invention may be present on both sides of a superconducting layer, rather than only one side as depicted in FIG. 1.

Barrier buffering layer 30 is preferably made of YSZ, which is desired because it is a barrier to diffusion of the silicon present in the preferred material of passivating layer 32. The YSZ of barrier buffering layer 30 is deposited onto superconducting layer 22, preferably using the same PERS process used for depositing the YSZ of buffering layer 28. PERS is preferred because it does not damage superconducting layer 22. Preferably, the YSZ of barrier buffering layer 30 is deposited in a thickness of approximately 500 Å. However, it is presently contemplated that an acceptable range of thickness of the YSZ is 100 Å to 1000 Å, although other thicknesses may be satisfactory. Although YSZ is the presently-preferred material for buffering layer 30, other materials, such as ceria and the like, may be used. In selecting such alternative materials it is preferable that the selected material have a relatively high oxygen diffusion and block indiffusion of constituent chemicals from adjacent layers. passivating layer 32 provides a barrier to outdiffusion of oxygen from barrier buffering layer 30 and indiffusion of moisture from outside device 20. Passivating layer 32 is preferably made of silicon nitride, which is a good barrier to both moisture and diffusion of oxygen. Beneficially, silicon nitride is also a good barrier to salts, alkali metals and other substances that would be detrimental to the critical properties of the superconducting material if allowed to diffuse into superconducting layer 22. Moreover, silicon nitride is a relatively hard material that protects device 20 from scratches, dents and the like. The silicon nitride of passivating layer 32 may be deposited onto the buffering layer using chemical vapor deposition (CVD) by reacting ammonia with a silicon-containing gas. Such reactions generally occur in a temperature range of approximately 650° C. to approximately 900° C. Because these temperatures can cause undesirable outdiffusion of oxygen from superconducting layer 22, it is preferred to deposit the silicon nitride using PECVD, which may be performed at a temperature as low as 200° C., where outdiffusion of oxygen from the superconducting material is relatively insignificant. Preferably, the silicon nitride of passivating layer 32 is deposited in a thickness of approximately 500 Å. However, it is presently contemplated that an acceptable range of thickness of the silicon nitride is 100 Å to 1000 Å, although other thicknesses may be satisfactory. An alternative material for passivating layer 32 is silicon carbide.

Due to the generally high processing temperatures required to deposit the YSZ of barrier buffering layer 30, there is a tendency for some of the oxygen to outdiffuse from superconducting layer 22 during deposition of the barrier buffering layer. The inventors, therefore, have found that it is desirable to re-oxygenate superconducting layer 22 after depositing buffering layer 30 but prior to depositing passivating layer 32, for example, by performing a conventional re-oxygenation anneal.

The relatively high oxygen diffusion of barrier buffering layer 30 makes possible re-oxygenation of superconducting layer 22 after depositing barrier buffering layer 30. Although re-oxygenation parameters, e.g., pressure, temperature, oxygen flow rate and the like, are dependent upon the oxide superconducting material used, one skilled in the art will recognize that these parameters may be determined empirically to optimize the critical temperature, critical current density and critical magnetic field of the particular superconducting material selected. After re-oxygenation, passivating layer 32 is deposited, preferably using a lowtemperature PECVD process to minimize outdiffusion of oxygen from the re-oxygenated superconducting material. Passivating layer 32, with its relatively low oxygen diffusion constant, effectively caps barrier buffering layer 30 to contain the oxygen present within barrier buffering layer 30 and superconducting layer 22.

A beneficial feature of passivation barrier 24 described above is that, when deposited in thin films, it is optically transparent in the near infrared wavelengths and possibly other useful wavelengths and, therefore, is particularly suited for use in optical-electronic devices, such as optical demultiplexers of the type disclosed in U.S. Pat. No. 5,566,015 to Puzey, and optical modulators, such as that disclosed in U.S. Pat. No. 5,768,002 to Puzey, which are both used in fiber optic data transmission systems. An example of a simple optical-electronic device is shown in FIGS. 4A–4D and described below.

Another beneficial feature of passivation barrier 24 is that it can withstand post-processing temperatures of up to 800° C. In addition, passivation barrier 24 is compatible with the present manufacturing methods for forming Very Large Scale Integration (VLSI) integrated devices.

Figure 2:
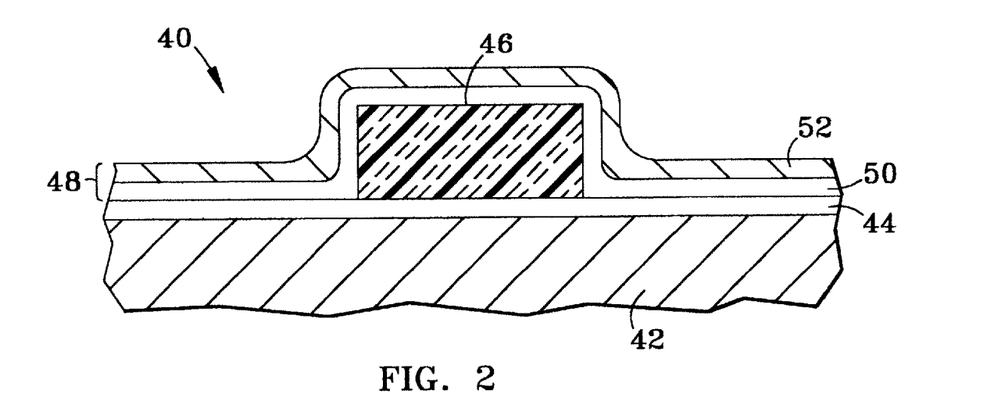
FIG. 2 is a partial cross-sectional view illustrating a microelectronic device having a discrete superconductor element and a passivation barrier according to the present invention.

Referring now to FIG. 2, there is shown a microelectronic device 40 comprising a silicon substrate 42, a superconductor buffering layer 44, a discrete superconductor element 46 and a passivation barrier 48 of the present invention. Element 46 comprises a superconducting material and generically represents a superconductor element such as a flat wire, waveguides, antenna or the like. Superconductor buffering layer 44 is typically coextensive with the substrate 42, extending laterally from beneath element 46. Alternatively, the buffering layer may be coextensive with only the waveguide strip. However, this would require an etching step that is not necessary for the structure of the present device.

Similar to the passivation barrier shown in FIG. 1, passivation barrier 48 consists of a barrier buffering layer 50 and a silicon nitride passivating layer 52, both of which generally conform to the exposed surfaces of un-passivated device 40. Although both layers are conformal, the passivating layer 52 is somewhat less conformal than underlying barrier buffering layer 50. This is a result of the relatively low temperature deposition of the silicon nitride using the preferred PECVD process. Low temperature deposition tends to grow layers that are less conformal than higher temperature deposition. Therefore, a more conformal silicon nitride layer 52 can be achieved using a higher temperature deposition process, such as CVD.

Passivation barrier 48 is deposited onto device 40 such that it covers element 46 and adjacent regions of buffering layer 44. Although the passivation barrier is shown as being coextensive with the substrate, only the side and top surfaces of element 46 must be covered. The protective properties of passivation barrier 48, however, may be desirable for regions of device 40 other than just element 46. Regardless of the extent that device 40 is covered by passivation barrier 48, it is generally desirable that any free surfaces and/or edges of buffering layers 44 and 50 be covered with passivating layer 52 to completely seal the device.

Figure 3A:
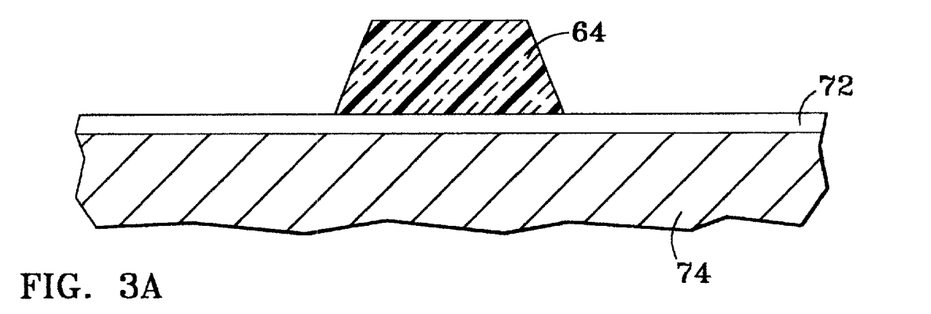
FIGS. 3A–3G are partial cross-sectional views at various stages of manufacture of a superconductor device having an electrical contact extending through a passivation barrier according to the present invention.
Figure 3B:
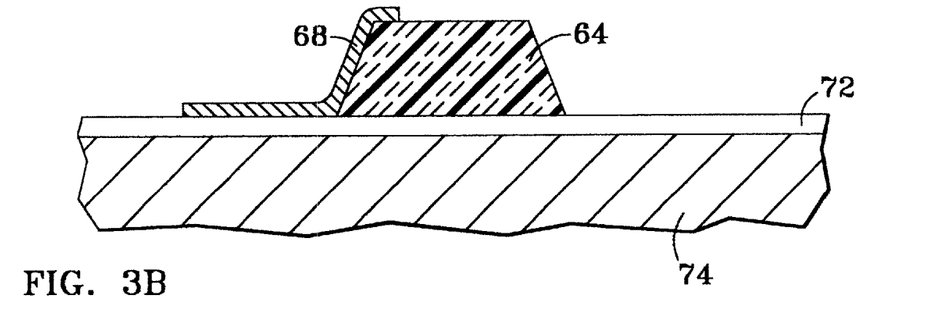
Figure 3C:
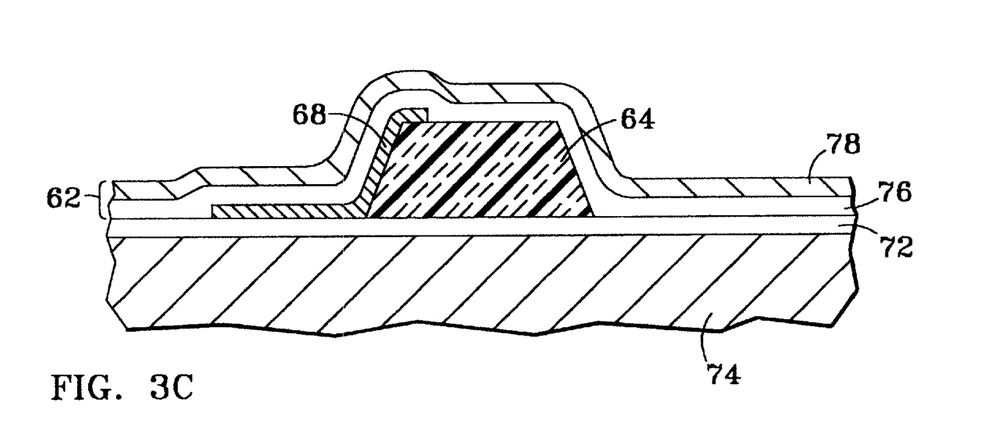
Figure 3D:
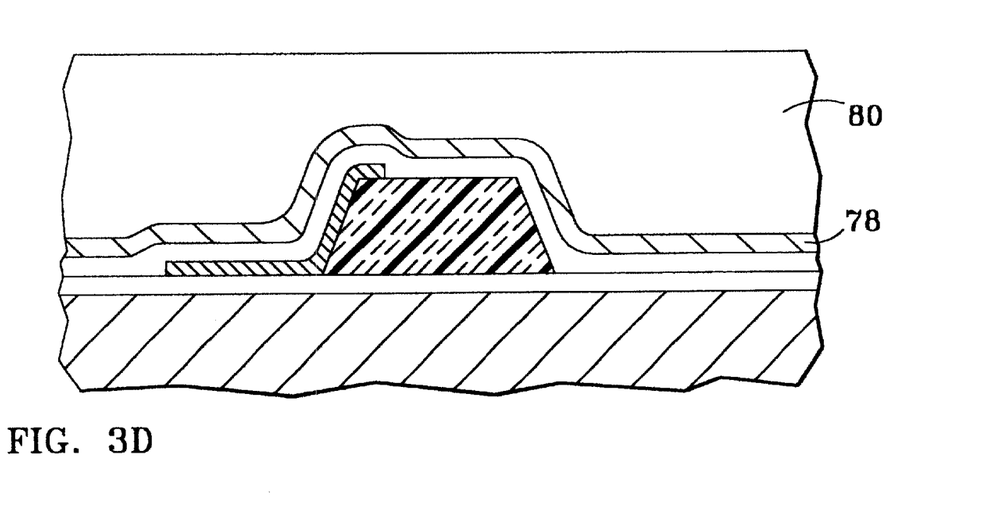
Figure 3E:
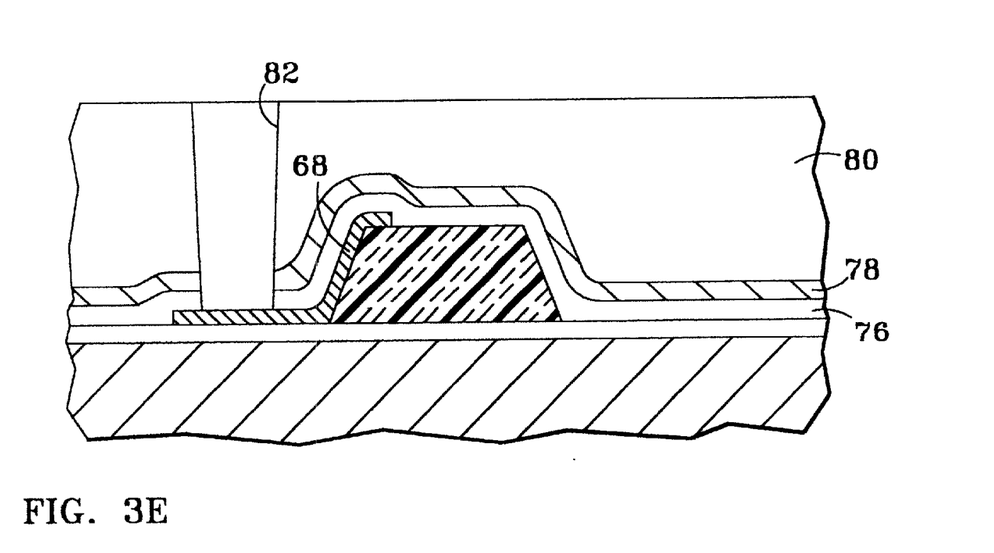
Figure 3F:
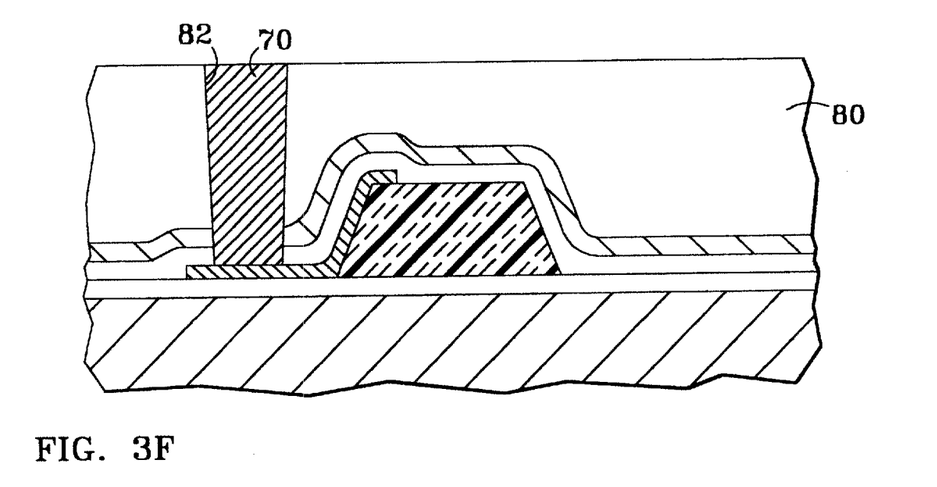
Figure 3G:
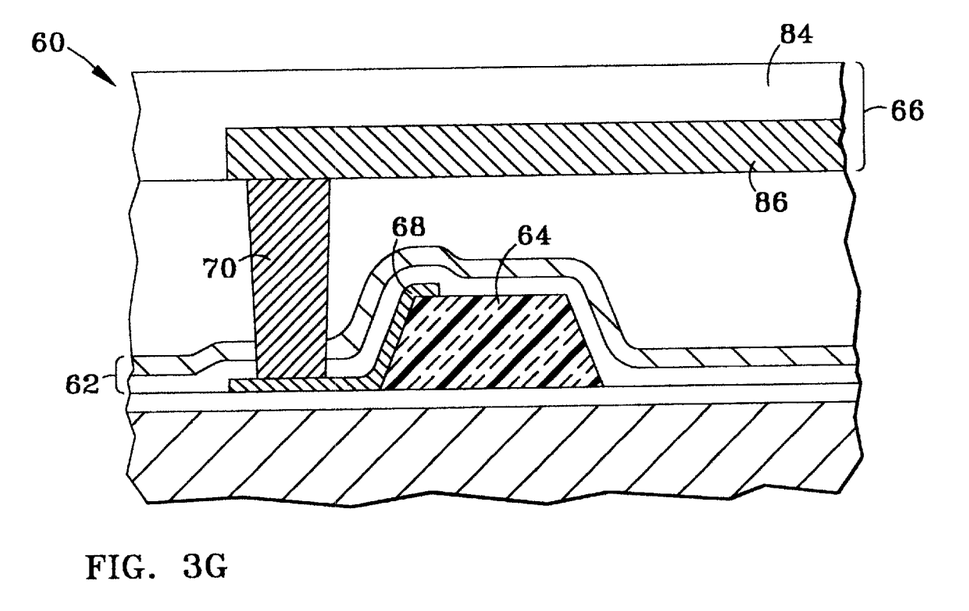

FIG. 3G illustrates a microelectronic device 60, such as a Josephson junction, that incorporates a passivation barrier 62 of the present invention and includes an electrical interconnect between a superconducting element 64 and a back end of line (BEOL) metal level 66. The electrical interconnect comprises a strap contact 68 and a post contact 70. FIGS. 3A–F show device 60 at various stages of its manufacture. It should be understood that device 60 of FIGS. 3A–G is merely illustrative and that the barrier of the present invention may be used for any superconducting device and with any manufacturing process.

Referring to FIG. 3A, after depositing a buffering layer 72 onto a substrate 74 in the manner described above relative to layer 28, superconducting element 64 is formed on top of such layer. Element 64 is formed by depositing a superconducting material onto layer 72 using the processes described above relative to layer 22. Then portions of the superconducting material are removed using known masking and etching processes so as to form element 64. After superconducting element 64 has been formed, strap contact 68 is patterned onto portions of superconducting element 64 and buffering layer 72 using methods known to those skilled in the art. FIG. 3B shows device 60 after strap contact 68 has been patterned. Strap contact 68 extends onto buffering layer 72 so that when post contact 70 is formed, see below, passivation barrier 62 at superconducting element 64 is not disturbed. Preferably, strap contact 68 is made of a noble metal, such as gold or silver, although a less conductive material such as aluminum or copper may also be used under certain circumstances.

Referring to FIG. 3C, after strap contact 68 has been formed, a barrier buffering layer 76, preferably made of YSZ, is deposited onto superconducting element 64, strap contact 68 and buffering layer 72 in the manner described above relative to layer 30. After barrier buffering layer 76 has been deposited, an oxygen anneal, as described above, may be performed to introduce oxygen into superconducting element 64 to replace the oxygen that may have been lost during prior high-temperature processing. A passivating layer 78 made of silicon nitride is then deposited onto barrier buffering layer 76, as described above relative to layer 32, to form passivation barrier 62.

A dielectric layer 80 made of, e.g., boron phosphate silicon glass (BPSG), is then deposited onto passivating layer 78. The resulting sub-structure is shown in FIG. 3D. Other dielectric materials for dielectric layer 80 include phosphorous silicate glass, low dielectric fluorinated aerogels and the like. The dielectric material may be deposited by CVD, PECVD or the like. Following its deposition, dielectric layer 80 is planarized by chemical mechanical polishing.

Referring to FIG. 3E, a photo-resist mask (not shown) is patterned onto dielectric layer 80. A high-density plasma (HDP) reactive ion etch (RIE) is then used to etch through dielectric layer 80, passivating layer 78 and barrier buffering layer 76 to form a via 82 that extends to strap contact 68. The etch chemistry is formulated to preferentially etch the above-mentioned layers and stop at contact strip 68.

Via 82 is then filled with a refractory metal, such as tungsten, or refractory metal nitride or refractory metal silicide, using CVD, PECVD or the like, to form contact post 70. The metal deposited onto the upper surface of the dielectric layer is removed using chemical mechanical polishing. The result is contact post 70 having an upper surface flush with the upper surface of dielectric layer 80. This is shown in FIG. 3F.

After forming post contact 70, BEOL metal level 66, is fabricated using steps well known in the art. BEOL metal level 66 includes an insulator layer 84 and a plurality of interconnects 86 made of, e.g., aluminum, copper or the like. Interconnects 86 connect multiple superconducting and/or other microelectronic devices to one another. Multiple BEOL levels may be used for higher degrees of integration.

Although FIGS. 3A–3G illustrate a device having contacts made of non-superconducting materials, one skilled in the art will appreciate that devices having contacts made of superconducting material may be fabricated and protected with a passivation barrier according to the present invention.

Figure 4A:
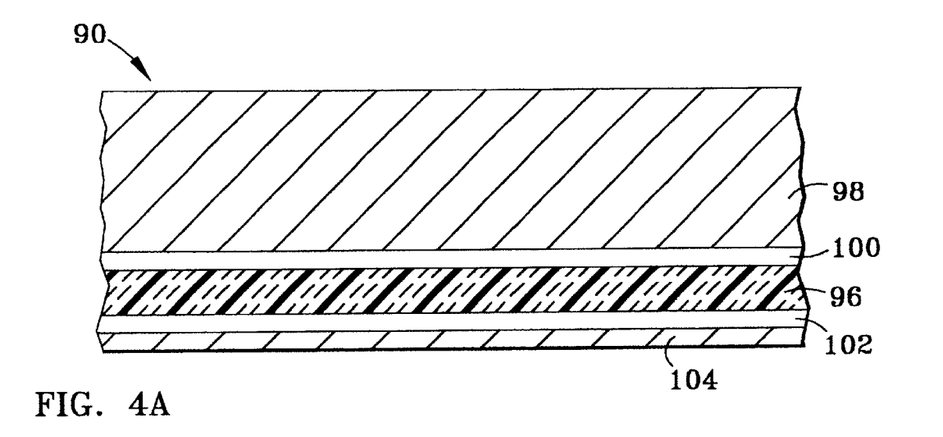
FIGS. 4A–4D are partial cross-sectional views at various stages of manufacture of a superconductor device having an optical window and a passivation barrier according to the present invention.
Figure 4B:
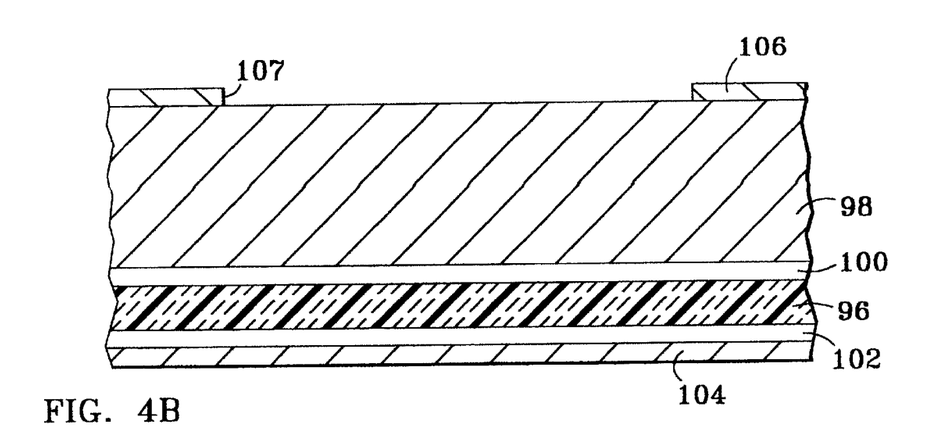
Figure 4C:
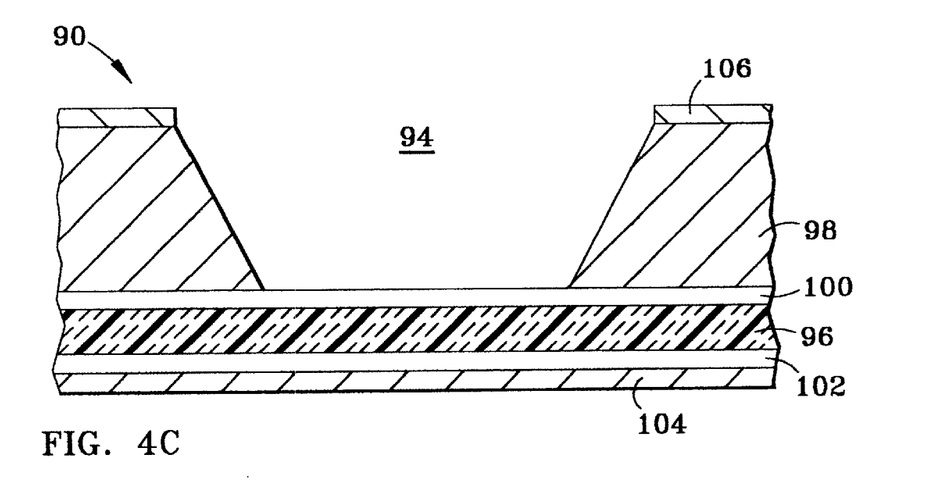
Figure 4D:
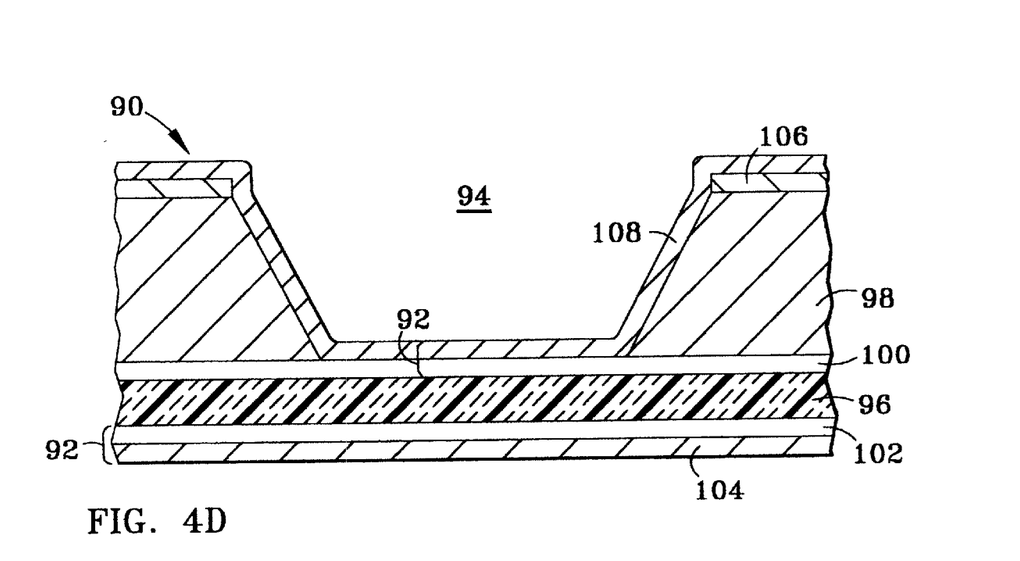

Referring now to FIG. 4D, there is shown a superconducting device 90 that incorporates a passivation barrier 92 of the present invention and has an optical window 94 that permits device 90 to be used as an optical device. Such optical devices are used, for example, in optical-electronic modulators and demultiplexers for fiber optic data transmission. Optical window 94 provides an optically transparent region which allows light to pass through device 90. FIGS. 4A–4C show device 90 at various stages of manufacture.

FIG. 4A shows a basic substructure of device 90 prior to forming optical window 94. The substructure consists of a substrate 98, a first barrier buffering layer 100 (analogous to layer 28), superconducting layer 96 (analogous to layer 22), a second barrier buffering layer 102 (analogous to layer 30) and a first passivating layer 104 (analogous to layer 32). Second barrier buffering layer 102 and first passivating layer 104 form a first portion of passivating barrier 92 (see FIG. 4D).

Each of layers 96, 100, 102 and 104 are sufficiently thin to allow them to be optically transparent. For example, first and second barrier buffering layers 100, 102 and first passivating layer 104 are each preferably on the order of 500 Å in thickness. Superconducting layer 96 is generally between 500 Å and 3 microns in thickness. However, substrate 98 is typically a silicon wafer, which is on the order of 0.5 mm in thickness and, therefore, opaque. Thus, window 94 in substrate 98 is required to permit light to pass through device 90.

To form optical window 94, a hard mask layer 106 made of, e.g., silicon nitride, is deposited onto substrate 98 and is etched to include opening 107, as shown in FIG. 4B, using photoresist techniques known to those skilled in the art. After hard mask layer 106 has been etched at opening 107, substrate 98 is etched using a suitable preferential etching process that stops etching at first barrier buffering layer 100. FIG. 4C shows device 90 immediately after optical window 94 has been formed in substrate 98. Once optical window 94 has been formed, device 90 may be optionally re-oxygenated as described above to replace any oxygen in superconducting layer 96 that may have been lost during processing of device 90 up to this point.

Next, as shown in FIG. 4D, a second passivating layer 108 (analogous to layer 32) is deposited onto first buffering layer 100, substrate 98 at optical window 94 and hard mask layer 106, preferably using PECVD. If higher conformality is required, an alternative deposition process performed at a higher temperature may be used. Second passivating layer 108 is preferably on the order of 500 Å in thickness and is thus optically transparent. First buffering layer 100 and second passivating layer 108 together form a second region of passivation barrier 92.

Figure 5:
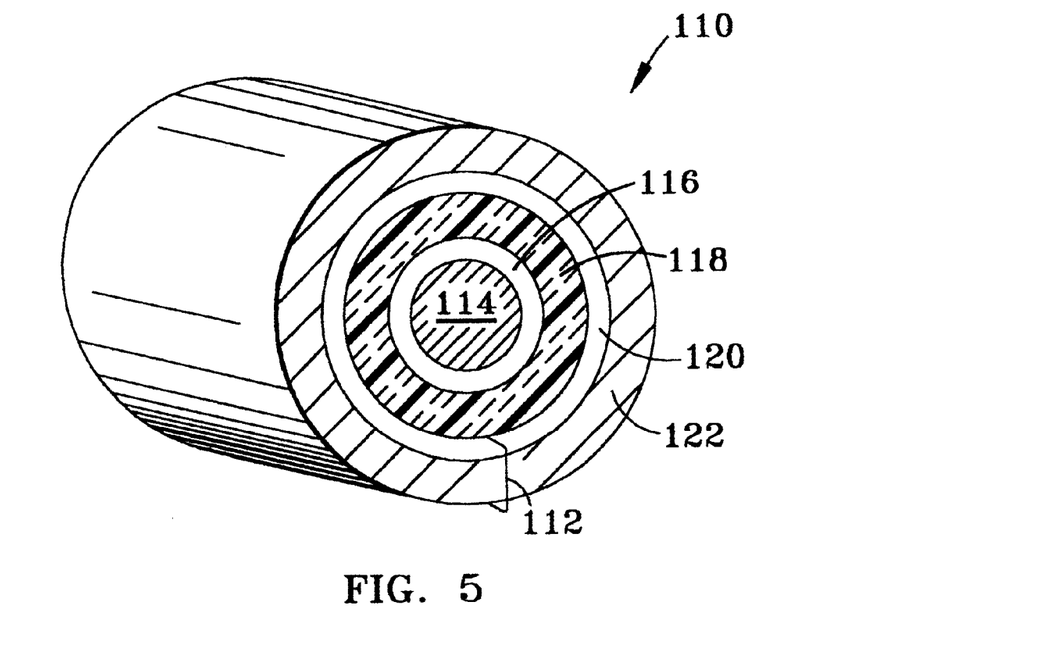
FIG. 5 is a perspective cross-sectional view illustrating an annular superconducting conduit having a passivation barrier according to the present invention.

Referring now to FIG. 5, there is shown a superconducting conduit 110 that includes a passivation barrier 112 of the present invention. Superconducting conduit 110 includes a wire core 114 made of, e.g., nickel, onto which is deposited a buffering layer 116 (analogous to layer 28), which provides a barrier to outdiffusion of nickel from wire core 114. Outwardly adjacent buffering layer 116 is a superconducting layer 118 (analogous to layer 22) made of an oxide superconducting material. To superconducting layer 118 is applied passivating barrier 112, which consists of a barrier buffering layer 120 (analogous to layer 30) in contact with superconducting layer 118 and a silicon nitride passivating layer 122 (analogous to layer 32) deposited onto buffering layer 120. Such a superconducting conduit may be made using the continuous coating process disclosed in U.S. Pat. No. 5,866,195 to Lemelson, which is incorporated herein by reference, which includes a series of chambers through which a wire core passes and is provided with the various layers that form the conduit, or other techniques known in the art.

Figure 6:
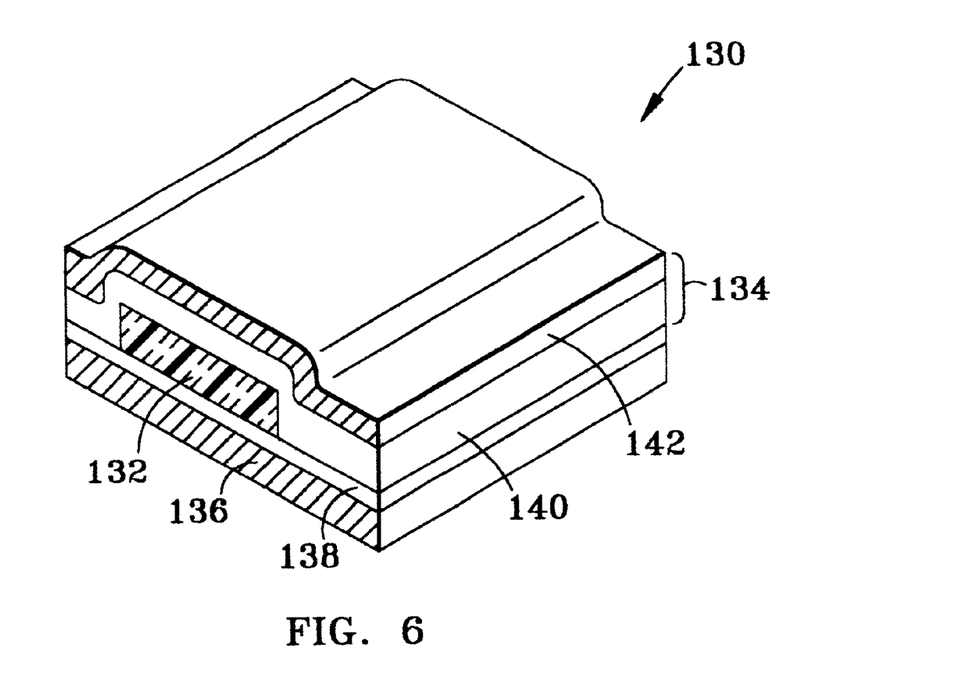
FIG. 6 is a perspective cross-sectional view illustrating a superconducting strip having a passivation barrier according to the present invention.

FIG. 6 shows a superconducting tape 130 that includes a passivation barrier 134 of the present invention. Superconducting tape 130 may be used, for example, to wind a superconducting magnet. Tape 130 comprises an elongate oxide superconducting strip 132 (analogous to layer 22), a biaxially textured nickel substrate 136 and a buffering layer 138 (analogous to layer 28) sandwiched therebetween. One method of making tape 130 includes a Rolling Assisted Biaxial Textured Substrate (RABiTS) process, such as that disclosed in U.S. Pat. No. 5,898,020 to Goyal et al., which is incorporated herein by reference, whereby grain alignment is mechanically induced into the nickel substrate 136. Biaxial textured buffering layer 138 is deposited onto substrate 136 and thereafter superconducting strip 132 is formed onto buffering layer 138. Subsequent to forming superconducting strip 132, passivation barrier 134 (analogous to passivation barrier 24), which comprises a barrier buffering layer 140 and a silicon nitride passivating layer 142, is deposited.

Alternatively, it appears that tape 130 may be made by first depositing buffering layer 138, superconducting strip 132 and barrier buffering layer 140 onto nickel substrate 136 and then mechanically drawing and rolling the resulting laminate to the desired dimensions. After mechanical treatment, barrier buffering layer 140 is then coated with silicon nitride to form passivating layer 142. The silicon nitride must be deposited after the mechanical treatment because it is not malleable and would not stand up to the mechanical treatment.

Advantages of the multi-layer passivation barrier of the present invention include its physical robustness and ability to provide an excellent barrier to elements detrimental to the critical properties of an oxide superconducting material. The robustness of the passivation barrier allows it to withstand post-processing temperatures up to 800° C. and protect underlying structures from mechanical damage such as scratches.

The above-mentioned advantages allow the passivation barrier of the present invention to be used for VLSI integration of superconducting devices, such as Josephson junctions, rapid single flux quantum (RSLF) logic and the like, that require BEOL processing. In addition, these advantages permit use of the passivation barrier to protect a variety of devices, such as superconducting quantum interface devices (SQUIDs), magnetometers, gradiometers, microwave filters, integrated gallium arsenide devices and the like, from oxygen and moisture.

In addition, the passivation barrier of the present invention is optically transparent, which allows superconducting elements to be used as optical devices, such as optical superconducting transmitters, bolometers and the like. Moreover, the oxygen permeability of the barrier buffering layer permits an underlying superconducting material to be re-oxygenated just before the device is "capped" by the passivating layer, which prevents diffusion of oxygen out of the superconducting material. In this manner, oxygen lost from the superconducting material during prior processing may be replaced to restore the critical properties that may have been adversely affected by the prior oxygen loss.

Although the invention has been described and illustrated with respect to the exemplary embodiments thereof, it should be understood by those skilled in the art that the foregoing and various other changed, omissions and additions may be made therein and thereto, without parting from the spirit and scope of the present invention.

What is claimed is:

1. A passivation barrier for an oxygen-containing material having a physical property and disposed on a substrate, comprising:
   a) a first layer spaced from die substrate, said first layer made of silicon nitride and having a first surface and a second surface, said silicon Stride comprising a constituent element that changes the physical property of the oxygen-containing material when said constituent element diffuses into the oxygen-containing material; and
   b) a second layer made of a non-conductive material and having a first surface and a second surface, said first surface of said second layer confront said second stiiface of said first layer, said second surface of said second layer confronting the oxygen-containing material, said second layer being a barrier to diffusion of said constituent element from said first surface of said second layer to said second surface of said second layer.

2. A superconductor device, comprising:
   a) a substrate;
   b) a superconducting element disposed on said substrate and having a critical temperature, $T_c$;
   c) a first layer spaced from said substrate, said first layer made of a non-polymer material and having a first surface and a second surface, said non-polymer material comprising a constituent clement that changes said $T_c$ of said superconducting element when said constituent element diffuses into said superconducting element;
   d) a second layer made of a non-conductive material and having a first surface and a second surface, said first surface of said second layer confronting said second surface of said first layer, at least a portion of said second surface of said second layer contacting said superconducting element, said second layer being a barrier to diffusion of said constituent element from said fit space of said second layer to said second surface of said second layer; and
   e) an electrical contact contacting said superconducting element and extending trough said second layer and said first layer.

3. A superconductor device, comprising:
   a) a substrate;
   b) a superconducting element disposed on said substrate and having a critical temperature, $T_c$;
   c) a first layer spaced from said substrate, said first layer made of a non-polymer material and having a first surface and a second surface, said non-polymer material comprising a constituent element that changes said $T_c$ of said superconducting element when said constituent element diffuses into said superconducting element;
   d) a second layer made of a noninductive material and having a first surface and a second surface, said first surface of said second layer confronting said second surface of said first layer, at least a portion of said second surface of said second layer contacting said superconducting element, said second layer being a barrier to diffusion of said constituent element from said first surface of said second layer to said second surface of said second layer; and e) a third layer forming an optical window to said superconducting element, said third layer having first and second surfaces and an aperture having a peripheral surface extending between said first and second surfaces of said third layer, said first surface of said third layer confronting said second layer, and said first layer confronting said second layer at said aperture.

4. A superconducting device, comprising;

a) a substrate;

b) a superconducting element disposed on said substrate and having a critical temperature, $T_c$;

c) a first layer spaced from said substrate, said first layer made of a non-polymer material and having a first surface and a second surface, said non-polymer material comprising a constituent element that changes said $T_c$ of said superconducting element when said constituent element diffuses into said superconducting element;

d) a second layer made of a non-conductive material and having a first surface and a second surface, said first surface of said second layer confronting said second surface of said first layer, at least a portion of said second surface of said second layer contacting said superconducting element, said second layer being a barrier to diffusion of said constituent element from said first surface of said second layer to said second surface of said second layer;

e) a third layer made of a non-polymer material and have a first surface and a second surface, said non-polymer material comprising a constituent element that changes said $T_c$ of said superconducting element when said constituent element diffuses into said superconducting element, and f) a fourth layer made of a nonconductive material and having a first surface and a second surface, said first surface of said fourth layer confronting said second surface of said third layer, said fourth layer being a barrier to diffusion of said constituent element from said fist surface of said fourth layer to said second surface of said fourth layer, wherein said superconducting element has a first surface and a second surface spaced apart from said first surface of said superconducting element, at least a portion of said second surface of said second layer contacting said first surface of superconducting element and at least a portion of said second surface of said fourth layer contacting said second surface of said superconducting element.

5. A superconducting conduit, comprising:

a) an elongate core having a longitudinal axis and a peripheral surface;

b) a first layer located radially outward from said longitudinal axis and surrounding said peripheral surface, said first layer comprising a superconducting material having a critical temperature, $T_c$, said first layer having an outer surface;

c) a second layer located radially outward from said longitudinal axis and surrounding said outer surface of said first layer, said non-polymer material comprising a constituent element that changes said $T_c$ of said superconducting material when said constituent element diffuses into said superconducting material; and d) a third layer located between said first layer and said second layer and surrounding said outer surface of said first layer, said third layer being a barrier to the diffusion of said constituent element.

6. A superconducting conduit according to claim 5, further comprising a fourth layer located between said core and said first layer, said fourth layer being a buffer between said core and said superconducting material.

7. A superconducting conduit according to claim 5, wherein said core comprises nickel.

8. A superconducting conduit according to claim 5, wherein said core has a circular cross-sectional shape transverse to said longitudinal axis.

9. A superconducting conduit according to claim 5, herein said third layer comprises cerium oxide.

10. A superconducting conduit according to claim 5, wherein said third layer comprises yttria stabilized zirconia.

11. A superconducting tape, comprising:

a) an elongate substrate, said substrate having a surface and a length;

b) a strip made of a superconducting material having a $T_c$, said elongate strip having a first surface and a second surface, said first surface confronting said surface of said substrate along a substantial portion of said length of said elongate substrate;

c) a first layer made of a non-polymer material and having a first surface and a second surface, said non-polymer material comprising a constituent element that changes said $T_c$ of said superconducting material when said constituent element diffuses into said superconducting material; and d) a second layer made of a non-conductive material and having a first surface and a second surface, said first surface of said second layer confronting said surface of said first layer, at least a portion of said second surface of said second layer confronting said surface of said strip, said second layer being a barrier to diffusion of said constituent element from said first surface of said second layer to said second surface of said second layer.

12. A superconducting tape according to claim 11, further comprising a third layer located between said surface of said substrate and said second surface of said second layer, said buffering layer being a buffer between said substrate and said strip.

13. A superconducting tape according to claim 12, wherein said substrate comprises biaxially textured nickel.

14. A superconducting tape according to claim 11, wherein said second layer comprises cerium oxide.

15. A superconducting tape according to claim 11, wherein said second layer comprises yttria stabilized zirconia.

16. A method of passivating an oxygen-containing material, comprising the steps of:

a) providing a first material containing oxygen and having a physical property;

b) providing a second material containing a constituent chemical element that changes said physical property of said first material when said constituent element diffuses into first material, said second material being silicon nitride;

c) providing a third material that is a barrier to diffusion of said constituent element;

d) depositing said third material onto at least a portion of said first material to form a buffering layer; and e) depositing said second material onto at least a portion of said buffering layer to form a passivating layer.

* * * * *

UNITED STATES PATENT AND TRADEMARK OFFICE
CERTIFICATE OF CORRECTION

PATENT NO.   : 6,517,944 B1
DATED        : February 11, 2003
INVENTOR(S)  : Kenneth A. Puzey and Thomas G. Ference It is certified that error appears in the above-identified patent and that said Letters Patent is hereby corrected as shown below:

Column 10,
Line 51, delete the words "fit space" and insert -- first surface -- therefor.
Line 54, delete the word "trough" and insert -- through -- therefor.

Column 11,
Line 34, delete "have" and insert -- having -- therefor.

Column 12,
Line 14, delete "herein" and insert -- wherein -- therefor.

Signed and Sealed this

Thirtieth Day of September, 2003

JAMES E. ROGAN
*Director of the United States Patent and Trademark Office*